(12) United States Patent
Chen

(10) Patent No.: US 11,314,133 B2
(45) Date of Patent: Apr. 26, 2022

(54) SOURCE DRIVER AND DISPLAY DEVICE

(71) Applicant: TCL CHINA STAR OPTOELECTRONICS TECHNOLOGY CO., LTD., Shenzhen (CN)

(72) Inventor: Yongquan Chen, Shenzhen (CN)

( * ) Notice: Subject to any disclaimer, the term of this patent is extended or adjusted under 35 U.S.C. 154(b) by 274 days.

(21) Appl. No.: 16/627,339

(22) PCT Filed: Dec. 27, 2019

(86) PCT No.: PCT/CN2019/129051
§ 371 (c)(1),
(2) Date: Dec. 30, 2019

(87) PCT Pub. No.: WO2021/120292
PCT Pub. Date: Jun. 24, 2021

(65) Prior Publication Data
US 2021/0364870 A1 Nov. 25, 2021

(30) Foreign Application Priority Data
Dec. 17, 2019 (CN) .......................... 201911304228.9

(51) Int. Cl.
*G02F 1/1362* (2006.01)
*G09G 3/00* (2006.01)
*H05K 1/02* (2006.01)
(52) U.S. Cl.
CPC .. *G02F 1/136204* (2013.01); *G02F 1/136286* (2013.01); *G09G 3/006* (2013.01); *H05K 1/0259* (2013.01); *G09G 2330/04* (2013.01)

(58) Field of Classification Search
CPC ........ G02F 1/136204; G02F 1/136286; G09G 3/006; G09G 2330/04; H05K 1/0259
USPC .................................................. 349/149–152
See application file for complete search history.

(56) References Cited

U.S. PATENT DOCUMENTS

| 2008/0100763 | A1* | 5/2008 | Park | G02F 1/13452 349/42 |
| 2014/0139792 | A1* | 5/2014 | Zhu | G02F 1/1345 349/106 |
| 2018/0018910 | A1* | 1/2018 | Jang | G09G 3/2092 |
| 2018/0113333 | A1* | 4/2018 | Zhu | G02F 1/136286 |

* cited by examiner

*Primary Examiner* — Charles S Chang

(57) ABSTRACT

The present disclosure provides a source driver and a display panel. The source driver includes a printed circuit board, a flip-chip film, a source driver chip, a first connection line, and a test point. The source driver chip is encapsulated on the flip-chip film and connected to the display panel through the first connection line, and the first connection line is connected to the test point, wherein a conductive pattern is formed on the flip-chip film, the conductive pattern is grounded through a ground line, and the conductive pattern includes a tip portion configured to form a tip discharge effect to discharge static electricity on the test point to the ground line. Therefore, the present disclosure can conduct static electricity through the tip portion when electrostatic discharge occurs, thereby preventing the electrostatic discharge from damaging the driver chip through a test point path.

8 Claims, 2 Drawing Sheets

SOURCE DRIVER AND DISPLAY DEVICE

The present disclosure relates to the field of display technologies, and more particularly, to a source driver and a display device.

BACKGROUND OF INVENTION

Liquid crystal displays (LCDs) have many advantages such as thin body, power saving, no radiation, etc., and have been widely used, such as in LCD TVs, mobile phones, personal digital assistants (PDAs), digital cameras, computer screens or laptop screens, etc., dominating the field of flat panel displays.

Electro-static discharge (ESD) refers to a charge transfer caused by objects with different electrostatic potentials coming close to or in direct contact with each other. The electrostatic discharge will generate a transient voltage of thousands of volts, causing electrostatic damage and making liquid crystal display devices unable to operate normally. In order to prevent electrostatic damage, ESD tests need to be performed during production of liquid crystal display devices.

In a current chip on flex or chip on film (COF) design, as shown in FIG. 1, on a film, first two and last two output channels of source driver chip output traces are pulled to a test point. During an ESD capability test of a source driver chip output pin, the ESD discharge is performed at four test points, and an ESD discharge path is shown in bold in the figure. Because the discharge path is short and an overall trace impedance is very low, test failure often occurs when performing ESD capability testing of the source driver chip.

SUMMARY OF INVENTION

The present disclosure provides a source driver and a display panel, which can solve the problem of the failure of performing source driver ESD test.

To solve the above problems, the present disclosure provides a source driver includes a printed circuit board, a flip-chip film, a source driving chip, at least one first connection line, and a test point, wherein the flip-chip film is connected to the printed circuit board, the source driving chip is packaged on the flip-chip film and connected to the display panel through the at least one first connection line, and the at least one first connection line is connected to the test point; wherein a conductive pattern is formed on the flip-chip film, the conductive pattern is grounded through a ground line, the conductive pattern includes at least one tip portion configured to form a tip discharge effect to discharge a static electricity on the test point to the ground line; and the ground line is electrically connected to a ground terminal of an input side of the flip-chip film.

To solve the above problem, the present disclosure further provides a source driver of a display panel, wherein the source driver includes a printed circuit board, a flip-chip film, a source driving chip, at least one first connection line, and a test point, wherein the flip-chip film is connected to the printed circuit board, the source driving chip is packaged on the flip-chip film and connected to the display panel through the at least one first connection line, and the at least one first connection line is connected to the test point; wherein a conductive pattern is formed on the flip-chip film, the conductive pattern is grounded through a ground line, the conductive pattern includes a tip portion configured to form a tip discharge effect to discharge a static electricity on the test point to the ground line.

To solve the above problem, the present disclosure further provides a display device, wherein the display device includes a display panel and a source driver connected to the display panel, the source driver includes a printed circuit board, a flip-chip film, and a source driving chip, the flip-chip film connected to the printed circuit, the source driving chip is packaged on the flip-chip film, and includes at least one first connection line and a test point disposed on the at least one first connection line; wherein a conductive pattern is formed on the flip-chip film, the conductive pattern is grounded through a ground line, the conductive pattern includes at least one tip portion configured to form a tip discharge effect to discharge a static electricity on the test point to the ground line.

The present disclosure provides a source driver and a display panel. By adding a conductive pattern with a tip portion near a test point and having the conductive pattern be grounded through a ground line, static electricity can be conducted away through the tip portion when electrostatic discharge occurs, thereby preventing the electrostatic discharge from damaging a driver chip through a path of the test point.

DESCRIPTION OF FIGURES

In order to more clearly illustrate the embodiments or the technical solutions in the prior art or the embodiment, the figures used in the description of the embodiments or the prior art will be briefly introduced below. Obviously, the figures in the following description are merely some embodiments of the present disclosure, for those of ordinary skill in the art, other figures may be obtained based on these figures without inventive steps.

DETAILED DESCRIPTION OF PREFERRED EMBODIMENTS

In the following, the technical solutions in the embodiments of the present disclosure will be clearly and completely described with reference to the figures. Obviously, the described embodiments are only a part of the embodiments of the present disclosure, not all the embodiments. Based on the embodiments in the present disclosure, all other embodiments obtained by a person of ordinary skill in the art without creative steps shall fall within the protection scope of the present disclosure.

Unless otherwise defined, all technical and scientific terms used herein have the same meanings as commonly understood by those skilled in the technical field of the present disclosure; the terms used in the specification of the disclosure herein are for the purpose of describing specific embodiments only, not intended to limit the present disclosure; the terms "including" and "having" and any variations thereof in the description and claims of the application and the above description of the figures are intended to cover non-exclusive inclusion. The terms "first", "second", and the like in the specification and claims of the present disclosure or the above-mentioned figures are used to distinguish different objects and are not used to describe a specific order.

Reference to "an embodiment" herein means that a feature, structure, or characteristic described in connection with the embodiment may be included in at least one embodiment of the present disclosure. The appearances of this phrase in various places in the specification are not necessarily all referring to the same embodiment, nor independent or alternative embodiments, that are mutually exclusive with other embodiments. It is clearly and implicitly understood by those skilled in the art that the embodiments described herein may be combined with other embodiments.

Figure 1:
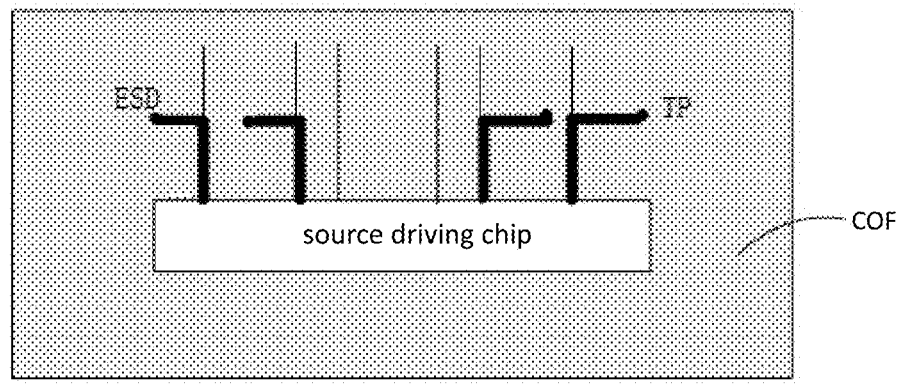
FIG. 1 is a schematic diagram of an embodiment of electrostatic discharge in the prior art.
Figure 2:
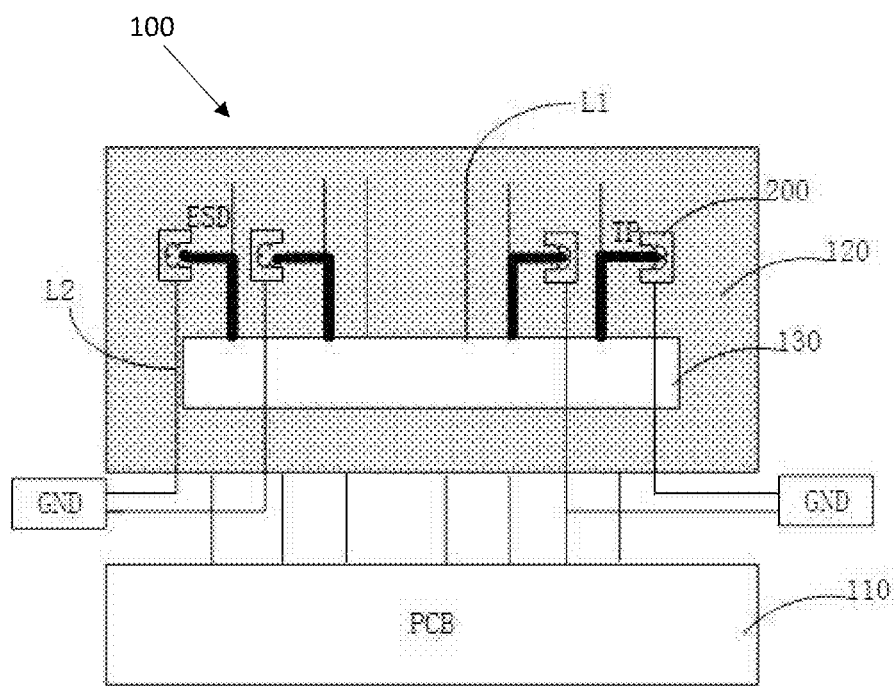
FIG. 2 is a schematic structural diagram of an embodiment of a source driver according to an embodiment of the present disclosure.

Please refer to FIG. 2. FIG. 2 is a schematic structural diagram of an embodiment of a source driver of the present disclosure. As shown in FIG. 2, the source driver 100 provided by the present disclosure includes a printed circuit board (PCB) 110, a flip-chip film 120, a source driver chip 130, at least one first connection line L1, and at least one test point TP.

The flip-chip film 120 is connected to the printed circuit board 110, the source driver chip 130 is encapsulated on the flip-chip film 120 and connected to the display panel (not shown in figure) through the at least one first connection line L1, and the at least one first connection line L1 is connected to the at least one test point TP.

Specifically, in the present disclosure, the at least one first connection line L1 may be a metal connection line, and a number of the at least one first connection line can be plural. The plurality of first connection lines L1 are arranged in parallel along a predetermined direction. In a specific embodiment, an arrangement direction of the first connection lines L1 is same as an arrangement direction of data lines in the display panel, which is not specifically limited herein. Optionally, a number of the at least one test point TP of the present disclosure is four, and four test points TP are respectively connected to first two and last two of the plurality of first connection lines L1.

Figure 3:
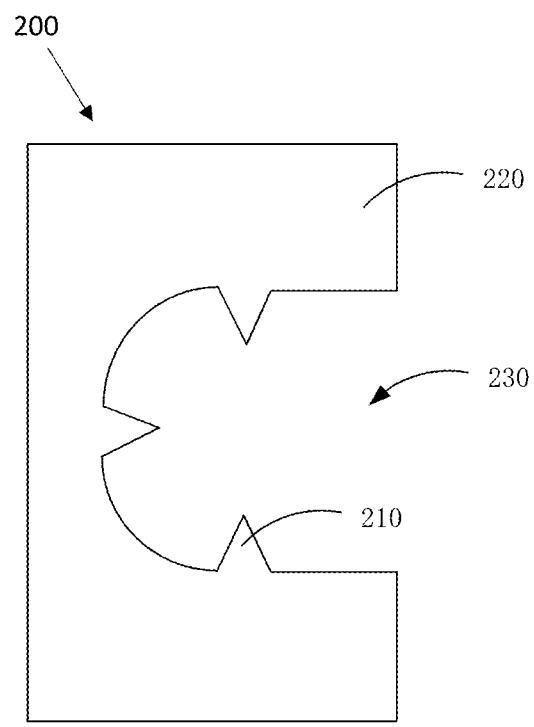
FIG. 3 is a schematic structural diagram of an embodiment of a conductive pattern according to an embodiment of the present disclosure.

Further, referring to FIG. 3, FIG. 3 is a schematic structural diagram of an embodiment of a conductive pattern according to an embodiment of the present disclosure. A conductive pattern 200 is formed on the flip-chip film 120, and the conductive pattern 200 is grounded through a ground line L2. Specifically, the conductive pattern 200 is electrically connected to a ground terminal on an input side of the flip-chip film 120 through the ground line L2.

Optionally, the conductive pattern 200 may be a metal conductive pattern, and the conductive pattern 200 may further include a tip portion 210 for forming a tip discharge effect to discharge static electricity on the at least one test point TP to the ground line L2. In this way, static electricity can be conducted away through the conductive pattern with the least resistance, thereby protecting the at least one test point TP from electrostatic discharge damage.

Further referring to FIG. 3, the conductive pattern 200 in the present disclosure further includes a connection portion 220, and the connection portion 220 also forms a test space 230. The tip portion 210 is connected to the connection portion 220 on a side of the connection portion 220 near the test space 230. The at least one test point TP is located in the test space 230.

Specifically, a number of the tip portion 210 may be plural, such as three shown in FIG. 3, and the plurality of tip portions 210 are arranged in an array on a peripheral side of the at least one test point TP. Of course, in other embodiments, four, five, six, etc. tip portions 210 may be provided, which is not specifically limited herein. In addition, the tip portions of the present disclosure may also be set to be an isosceles triangle, a cone, or the like, which is not specifically limited herein.

Further, in an embodiment of the present disclosure, at least part of a projection of the side of the connection portion 220 close to the test space 230 on the flip-chip film 120 is arc-shaped.

Specifically, the conductive pattern 200 in the present disclosure may further include only one tip portion 210, and the tip portion 210 is grounded through the ground line L2. Of course, the conductive pattern 200 of the present disclosure may also be provided in other shapes, and all including the structure of the tip portion of the present disclosure are within the protection scope of the present disclosure.

In the specific test scenario of the present disclosure, by adding the grounded conductive pattern 200 around the at least one test point TP, the output ESD capability of the source driver chip 130 can reach +/−4 KV.

In the above embodiment, by adding a conductive pattern with a tip portion near a test point and having the conductive pattern be grounded through a ground line, it is possible to conduct static electricity through the tip portion when static discharge occurs, thereby preventing damage to a driver chip from electrostatic discharge through at least one test point path.

Figure 4:
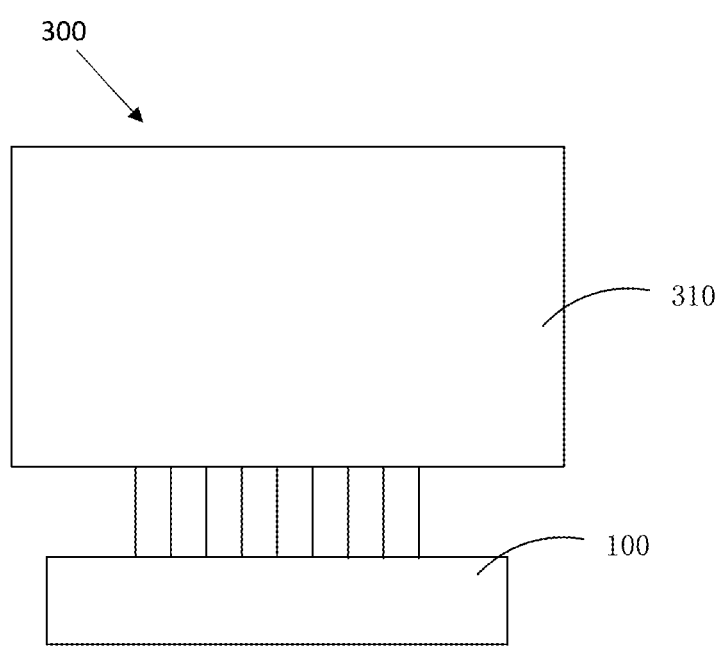
FIG. 4 is a schematic structural diagram of an embodiment of a display device of the present disclosure.

Please refer to FIG. 4, FIG. 4 is a schematic structural diagram of an embodiment of a display device of the present disclosure. The display device 300 includes a display panel 310 and a source driver 100.

Please refer to FIG. 2, the source driver 100 includes a printed circuit board (PCB) 110, a flip-chip film 120, a source driver chip 130, at least one first connection line L1, and at least one test point TP.

The flip-chip film 120 is connected to the printed circuit board 110, and the source driver chip 130 is encapsulated on the flip-chip film 120 and connected to the display panel 310 through the at least one first connection line L1. The at least one first connection line L1 is connected to the at least one test point TP.

Specifically, in the present disclosure, the at least one first connection line L1 may be a metal connection line, and a number of the at least one first connection line can be plural. The plurality of first connection lines L1 are arranged in parallel along a predetermined direction. In a specific embodiment, an arrangement direction of the plurality of first connection lines L1 is same as an arrangement direction of data lines in the display panel, which is not specifically limited herein. Optionally, a number of the at least one test point TP in the present disclosure is four, and four test points TP are respectively connected to first two and last two of the plurality of first connections L1.

Further, referring to FIG. 3, FIG. 3 is a schematic structural diagram of an embodiment of a conductive pattern according to an embodiment of the present disclosure. A conductive pattern 200 is formed on the flip-chip film 120, and the conductive pattern 200 is grounded through a ground line L2. Specifically, the conductive pattern 200 is electrically connected to the ground terminal GND on an input side of the flip-chip film 120 through the ground line L2.

Optionally, the conductive pattern 200 may be a metal conductive pattern, and the conductive pattern 200 may further include at least one tip portion 210 configured to form a tip discharge effect to discharge static electricity on the at least one test point TP to the ground line L2. In this way, static electricity can be conducted away through the conductive pattern with the least resistance, thereby protecting the at least one test point TP from electrostatic discharge damage.

Further referring to FIG. 3, the conductive pattern 200 in the present disclosure further includes a connection portion 220, and the connection portion 220 also forms a test space 230. The tip portion 210 is connected to the connection portion 220 on a side of the connection portion 220 near the test space 230. The at least one test point TP is located in the test space 230.

Specifically, a number of the at least one tip portion 210 may be plural, such as three shown in FIG. 3, and the plurality of tip portions 210 are arranged in an array on a peripheral side of the at least one test point TP. Of course, in other embodiments, four, five, six, etc. tip portions 210 may be provided, which is not specifically limited herein. In addition, the tip portions of the present disclosure may also be set to be an isosceles triangle, a cone, or the like, which is not specifically limited herein.

Further, in an embodiment of the present disclosure, at least part of a projection of the side of the connection portion 220 close to the test space 230 on the flip-chip film 120 is arc-shaped.

Specifically, the conductive pattern 200 in the present disclosure may further include only one tip portion 210, and the tip portion 210 is grounded through the ground line L2. Of course, the conductive pattern 200 of the present disclosure may also be provided in other shapes, and all including the structure of the tip portion of the present disclosure are within the protection scope of the present disclosure.

In the specific test scenario of the present disclosure, by adding the grounded conductive pattern 200 around the at least one test point TP, the output ESD capability of the source driver chip 130 can reach +/−4 KV.

In the above embodiment, by adding a conductive pattern with a tip portion near a test point, and having the conductive pattern be grounded through a ground line, it is possible to conduct static electricity through the tip portion when static discharge occurs, thereby preventing damage to a driver chip from electrostatic discharge through a test point path.

In summary, those skilled in the art can easily understand that the present disclosure provides a source driver and a display device. By adding a conductive pattern with a tip portion near a test point, and having the conductive pattern be grounded through a ground line, it is possible to conduct static electricity through the tip portion when static discharge occurs, thereby preventing damage to a driver chip from electrostatic discharge through a test point path.

The above description is only an implementation of the present disclosure and does not limit the patent scope of the present disclosure. Any equivalent structure or equivalent process transformation made using the contents of the description and figures of the present disclosure, or directly or indirectly used in other related technical fields be included in the patent protection scope of the present disclosure.

What is claimed is:

1. A source driver of a display panel, wherein the source driver comprises a printed circuit board, a flip-chip film, a source driver chip, at least one first connection line, and at least one test point, wherein the flip-chip film is connected to the printed circuit board, the source driving chip is encapsulated on the flip-chip film and connected to the display panel through the at least one first connection line, and the at least one first connection line is connected to the at least one test point;

wherein a conductive pattern is formed on the flip-chip film, the conductive pattern is grounded through a ground line, and the conductive pattern comprises at least one tip portion configured to form a tip discharge effect to discharge static electricity on the at least one test point to the ground line; and wherein the conductive pattern comprises a connection portion, the connection portion is formed with a test space, the tip portion is disposed on a side of the connection portion close to the test space and is connected to the connection portion, and the at least one test point is positioned in the test space; and wherein a number of the tip portion is plural, and the plurality of tip portions are arranged in an array on a peripheral side of the at least one test point.

2. The display device as claimed in claim 1, wherein the ground line is electrically connected to a ground terminal of an input side of the flip-chip film.

3. A source driver of a display panel, wherein the source driver comprises a printed circuit board, a flip-chip film, a source driver chip, at least one first connection line, and at least one test point, wherein the flip-chip film is connected to the printed circuit board, the source driver chip is encapsulated on the flip-chip film and connected to the display panel through the at least one first connection line, and the at least one first connection line is connected to the at least one test point;

wherein a conductive pattern is formed on the flip-chip film, the conductive pattern is grounded through a ground line, the conductive pattern comprises a tip portion configured to form a tip discharge effect to discharge static electricity on the at least one test point to the ground line;

wherein the conductive pattern comprises a connection portion, the connection portion is formed with a test space, the tip portion is disposed on a side of the connection portion close to the test space and is connected to the connection portion, and the at least one test point is positioned in the test space; and wherein a number of the at least one first connection line is plural, the plurality of first connection lines are arranged in parallel along a direction, a number of the at least one test point is four, and the four test points are respectively connected to first two and last two of the plurality of first connection lines.

4. The source driver as claimed in claim 3, wherein a number of the tip portion is plural, and the plurality of tip portions are arranged in an array on a peripheral side of the at least one test point.

5. The source driver as claimed in claim 3, wherein at least part of a projection of the side of the connection portion close to the test space on the flip-chip film is arc-shaped.

6. A display device, wherein the display device comprises a display panel and a source driver connected to the display panel, the source driver comprises a printed circuit board, a flip-chip film, and a source driver chip, the flip-chip film is connected to the printed circuit board, and the source driver chip is encapsulated on the flip-chip film and comprises at least one first connection line and at least one test point disposed on the at least one first connection line;

wherein a conductive pattern is formed on the flip-chip film, the conductive pattern is grounded through a ground line, and the conductive pattern comprises at least one tip portion configured to form a tip discharge effect to discharge static electricity on the at least one test point to the ground line;

wherein the conductive pattern comprises a connection portion, the connection portion is formed with a test space, the at least one tip portion is disposed on a side of the connection portion close to the test space and is connected to the connection portion, and the at least one test point is positioned in the test space; and wherein at least part of a projection of the side of the connection portion close to the test space on the flip-chip film is arc-shaped.

7. The display device as claimed in claim 6, wherein a number of the at least one tip portion is plural, and the plurality of tip portions are arranged in an array on a peripheral side of the at least one test point.

8. The display device as claimed in claim 6, wherein a number of the at least one first connection line is plural, the plurality of first connection lines are arranged in parallel along a direction, a number of the at least one test point is four, and the four test points are respectively connected to first two and last two of the plurality of first connection lines.

* * * * *